United States Patent
Wada et al.

(10) Patent No.: US 11,855,166 B2
(45) Date of Patent: Dec. 26, 2023

(54) SEMICONDUCTOR DEVICE INCLUDING SUB-CELL DISPOSED AT CHIP CENTER

(71) Applicant: HITACHI ASTEMO, LTD., Hitachinaka (JP)

(72) Inventors: Shinichirou Wada, Tokyo (JP); Tomohiko Yano, Tokyo (JP); Yoichiro Kobayashi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 225 days.

(21) Appl. No.: 17/618,763

(22) PCT Filed: Jun. 9, 2020

(86) PCT No.: PCT/JP2020/022617
§ 371 (c)(1),
(2) Date: Dec. 13, 2021

(87) PCT Pub. No.: WO2020/250869
PCT Pub. Date: Dec. 20, 2020

(65) Prior Publication Data
US 2022/0359694 A1    Nov. 10, 2022

(30) Foreign Application Priority Data
Jun. 14, 2019    (JP) .................................. 2019-110944

(51) Int. Cl.
*H01L 29/423* (2006.01)
*H01L 23/00* (2006.01)

(52) U.S. Cl.
CPC ........ *H01L 29/42376* (2013.01); *H01L 24/04* (2013.01); *H01L 29/42356* (2013.01);
(Continued)

(58) Field of Classification Search
CPC ................ H01L 29/42356; H01L 2224/04042
(Continued)

(56) References Cited

U.S. PATENT DOCUMENTS 5,376,815 A    12/1994  Yokota et al.
5,869,878 A *   2/1999  Hasegawa ........... H01L 27/0727
                                                            257/469
(Continued)

FOREIGN PATENT DOCUMENTS

JP    H02-052468 A     2/1990
JP    H0252468 A  *    2/1990  ......... H01L 29/7815
(Continued)

OTHER PUBLICATIONS

European search report dated May 25, 2023 with regards to corresponding European Patent Application No. 20823491. (Year: 2023).*
(Continued)

*Primary Examiner* — Matthew E. Gordon
(74) *Attorney, Agent, or Firm* — Foley & Lardner LLP

(57) ABSTRACT

There is a problem that an area of a principal current cell is reduced by an area of a bonding pad wiring layer for a sub-cell. A source electrode 9b of a current detection cell 22 is electrically connected to a bonding pad wiring layer 12 formed on an interlayer insulating film 10 via a wiring layer contact 11. The bonding pad wiring layer 12 is formed with respect to a source electrode 9a of a principal current cell 21 so as to cover a part of the source electrode 9a via the interlayer insulating film 10. As a result, the source electrode 9b is miniaturized, and a size of the source electrode 9b is made substantially equal to a size of the current detection cell 22. Therefore, the current detection cell 22 and the principal current cell 21 are disposed close to each other.

7 Claims, 9 Drawing Sheets

(52) U.S. Cl.
CPC ............... *H01L 2224/02375* (2013.01); *H01L 2224/02381* (2013.01); *H01L 2224/04042* (2013.01)

(58) Field of Classification Search
USPC .......................................................... 257/734
See application file for complete search history.

(56) References Cited

U.S. PATENT DOCUMENTS

| | | | |
|---|---|---|---|
| 2006/0055056 A1* | 3/2006 | Miura ................. | H01L 23/4334 257/E23.092 |
| 2006/0261391 A1* | 11/2006 | Nakazawa ........ | H01L 29/66734 257/E29.136 |
| 2011/0062514 A1* | 3/2011 | Takano ................. | H01L 27/088 257/334 |
| 2013/0020587 A1* | 1/2013 | Hino ................... | H01L 29/1095 257/77 |
| 2013/0168700 A1* | 7/2013 | Furukawa ........... | H01L 29/7815 257/77 |
| 2015/0008450 A1* | 1/2015 | Suekawa ............. | H01L 21/8213 257/77 |
| 2015/0325558 A1* | 11/2015 | Hikasa ................ | H01L 29/0619 257/49 |
| 2016/0365294 A1* | 12/2016 | Mori ................... | H01L 27/0629 |

FOREIGN PATENT DOCUMENTS

| | | |
|---|---|---|
| JP | H03-218643 A | 9/1991 |
| JP | H08-046193 A | 2/1996 |
| JP | 2004-014707 A | 1/2004 |
| WO | WO-2011/161721 A1 | 12/2011 |

OTHER PUBLICATIONS

Extended European search report issued in corresponding European Patent Application No. 20823491.4, dated May 25, 2023 (9 pages).
International Search Report with English translation and Written Opinion issued in corresponding application No. PCT/JP2020/022617 dated Oct. 13, 2020.

\* cited by examiner

SEMICONDUCTOR DEVICE INCLUDING SUB-CELL DISPOSED AT CHIP CENTER

TECHNICAL FIELD

The present invention relates to a semiconductor device.

BACKGROUND ART

A semiconductor device having a structure in which a principal current cell and a sub-cell (such as a current detection cell) are disposed on the same substrate has been known. PTL 1 discloses a metal-oxide-semiconductor field-effect transistor (MOSFET) semiconductor device in which a principal current cell and a current detection cell are disposed on the same substrate. In the MOSFET semiconductor device, a current detection bonding pad wiring layer connected to the current detection cell is formed above the current detection cell, and a source pad wiring layer connected to the principal current cell is formed in a region excluding a region where the current detection bonding pad wiring layer is formed.

CITATION LIST

Patent Literature

PTL 1: WO 2011/161721 A

SUMMARY OF INVENTION

Technical Problem

According to the technique disclosed in PTL 1, there is a problem that an area of the principal current cell is reduced by an area of the bonding pad wiring layer for the sub-cell.

Solution to Problem

A semiconductor device according to the present invention includes: a semiconductor substrate having a first main surface and a second main surface; a principal current cell formed on the semiconductor substrate and having a first electrode formed on the first main surface and a second electrode formed on the second main surface; a sub-cell formed on the first main surface and having a third electrode formed at a position of the same height as the first electrode with respect to the semiconductor substrate; a first bonding pad wiring layer connected to the third electrode and formed with respect to the first electrode so as to cover a part of the first electrode via an interlayer insulating film; and a first bonding pad portion connected to the first bonding pad wiring layer.

Advantageous Effects of Invention

According to the present invention, the area of the principal current cell is increased regardless of the area of the bonding pad wiring layer for the sub-cell.

DESCRIPTION OF EMBODIMENTS

Figure 1:
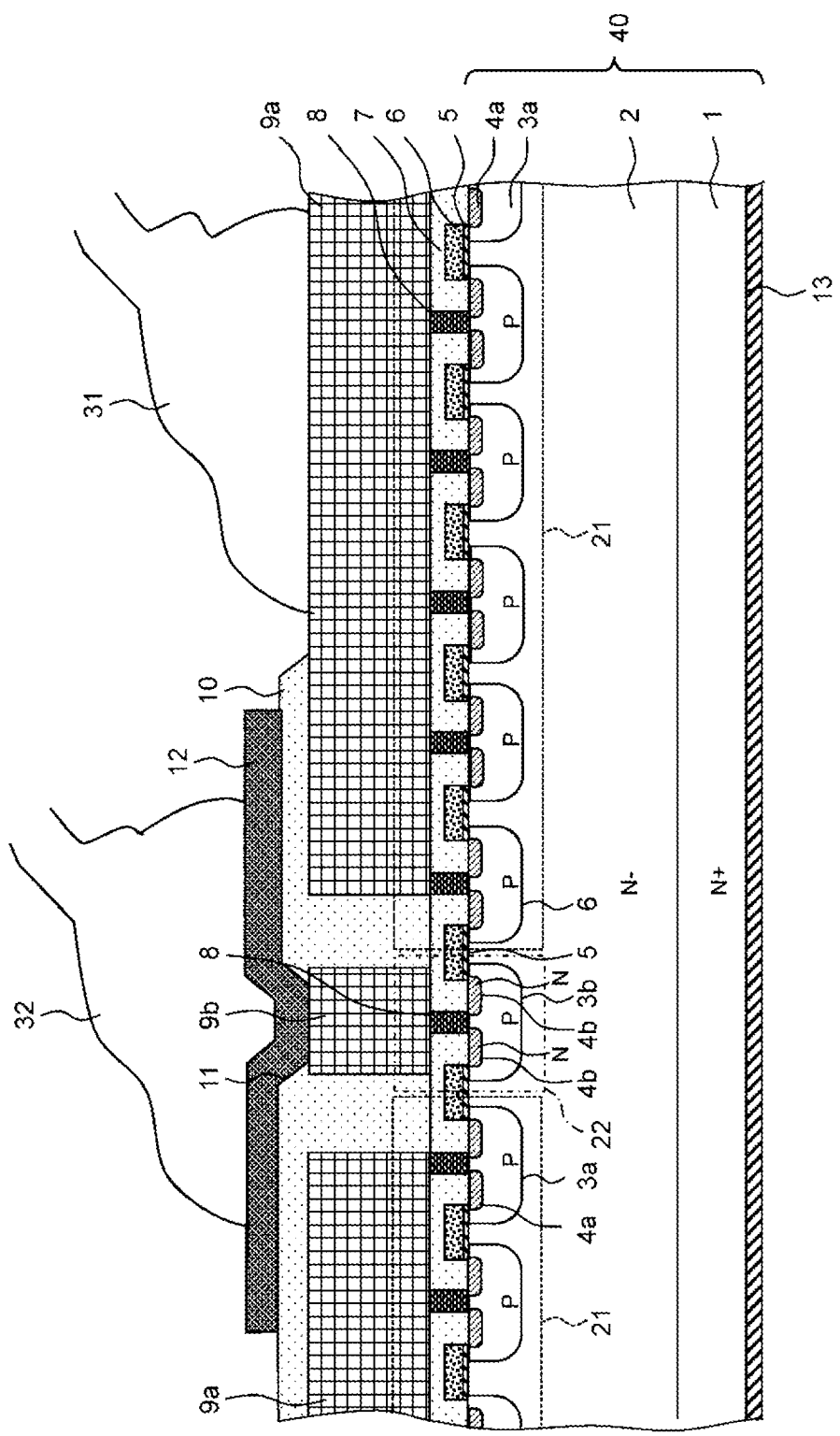
FIG. 1 is a cross sectional view illustrating a semiconductor device according to a first embodiment.

Embodiments of the present invention will be hereinafter described with reference to the drawings. In the embodiments, as an example of a semiconductor device, a power semiconductor device that mainly includes an n-type channel silicon carbide MOSFET incorporating a current detection element will be described. In each of the drawings, the same components will be denoted by the same reference numerals, and redundant descriptions will be omitted.

First Embodiment

Figure 2:
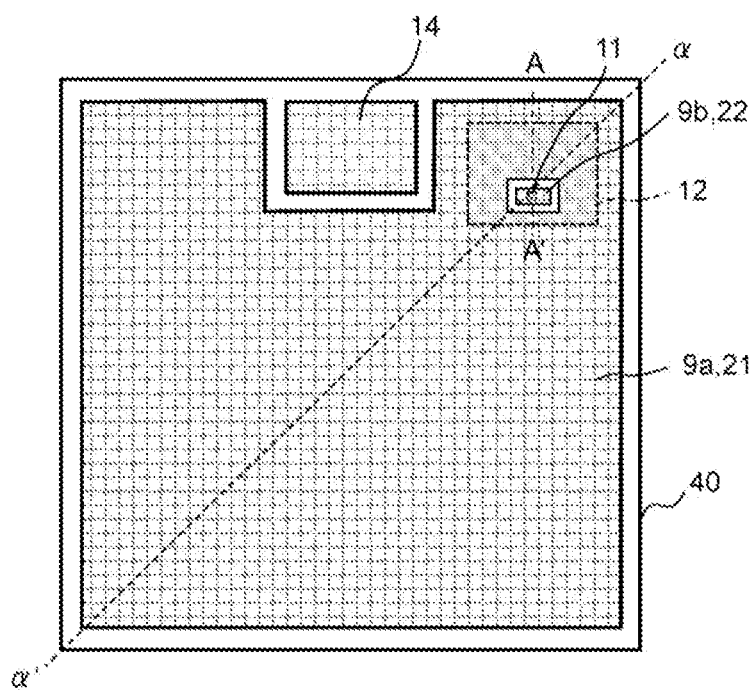
FIG. 2 is a plan view illustrating the semiconductor device according to the first embodiment.

FIG. 1 is a cross sectional view of a semiconductor device according to a first embodiment, and FIG. 2 is a plan view of the same. FIG. 1 is the cross sectional view taken along a broken line A-A' in FIG. 2.

As shown in FIG. 1, an n-type drift region 2 and an n-type drain region 1 having an impurity concentration higher than that of the drift region 2 are formed in a silicon carbide semiconductor substrate (hereinafter referred to as a semiconductor substrate) 40, and a drain electrode 13 made of a metal layer is formed on a back surface of the semiconductor substrate 40. A principal current cell 21, a current detection cell 22, and a gate control electrode 14 (see FIG. 2) that controls currents of the principal current cell 21 and the current detection cell 22 are disposed on the drift region 2.

As shown in FIG. 1, the principal current cell 21 is composed of P-well regions 3a each of which is formed on a part of the drift region 2, source regions 4a each of which is formed on a part of the P-well region 3a, gate oxide films and gate electrodes 6 each of which is formed on the semiconductor substrate 40 adjacent to the source regions 4a, contacts 8 each of which is electrically connected to the P-well region 3a and the source regions 4a, and a source electrode 9a connected to the contacts 8. In the above state, when a positive voltage with respect to the source electrode 9a is applied to the drain electrode 13 and a positive voltage with respect to the source electrode 9a is applied to each of the gate electrodes 6, a current flows from the drain electrode 13 to the source electrode 9a in the principal current cell 21.

The current detection cell 22 is composed of a P-well region 3b formed on a part of the drift region 2, source regions 4b each of which is formed on a part of the P-well region 3b, the gate oxide films 5 and the gate electrodes 6 each of which is formed on the semiconductor substrate 40 adjacent to the source regions 4b, the contact 8 electrically connected to the P-well region 3b and the source regions 4b, and a source electrode 9b connected to the contact 8.

The source electrode 9b of the current detection cell 22 is electrically connected to a bonding pad wiring layer 12 formed on an interlayer insulating film 10 via a wiring layer contact 11. The bonding pad wiring layer 12 is formed with respect to the source electrode 9a of the principal current cell 21 so as to cover a part of the source electrode 9a via the interlayer insulating film 10.

An electrically connected bonding pad portion 32 is formed on the bonding pad wiring layer 12 connected to the current detection cell 22. Therefore, in the current detection cell, when the voltage is applied to each of the gate electrodes 6, a detection current flows from the drain electrode 13 to the bonding pad portion 32 via the source electrode 9b. Bonding wires are integrally provided on the bonding pad portion 32.

Further, a part of the interlayer insulating film 10 on the source electrode 9a connected to the principal current cell 21 is opened, and a bonding pad portion 31 is formed on a part of the source electrode 9a. Thus, in the principal current cell, a principal current flows from the drain electrode 13 to the bonding pad portion 31 via the source electrode 9a. Bonding wires are integrally provided on the bonding pad portion 31.

Although not illustrated, the gate electrodes 6 of the principal current cell 21 and the gate electrodes 6 of the current detection cell 22 are electrically connected with a polysilicon layer or the like constituting each of the gate electrodes 6, and are connected to a bonding pad portion for a gate via the gate control electrode 14.

When potentials of the source electrode 9a of the principal current cell 21 and the source electrode 9b of the current detection cell 22 are equalized, the current flowing through the current detection cell 22 has a current sense ratio of a constant ratio substantially equal to an area ratio on a plane with respect to the current flowing through the principal current cell 21. The current sense ratio is commonly set to about 1:1,000 to 1:50,000. For example, when the current sense ratio is 1:10,000 and an area of the principal current cell on a substrate plane is 16 mm$^2$, an area of the current detection cell on the substrate plane is 1,600 µm$^2$. This area is two orders of magnitude smaller than 400×400 µm$^2$, which is an area of a bonding pad region necessary for connection of the bonding pad portion 32 of the semiconductor device. Therefore, as illustrated in FIG. 2, an area of the bonding pad wiring layer 12 to which the bonding pad portion 32 is connected on the substrate plane is made larger than the areas of the current detection cell 22 and the source electrode 9b. Since the bonding pad wiring layer 12 is provided so as to cover the source electrode 9b of the current detection cell 22 and a part of the source electrode 9a of the principal current cell 21, the source electrode 9b is miniaturized, and a size of the source electrode 9b is made substantially equal to a size of the current detection cell 22. Thus, the current detection cell 22 and the principal current cell 21 are disposed close to each other.

As a result, an increase in on-resistance due to a decrease in the area of the principal current cell 21 and an increase in chip cost due to an increase in chip size by providing the current detection cell 22 are suppressed. As compared with the conventional structure, a manufacturing cost of a wafer increases by forming the bonding pad wiring layer 12. However, a cost of a silicon semiconductor substrate accounts for a relatively large proportion of the total cost. Therefore, the present structure in which the increase in the chip size is suppressed and the number of chips acquired per wafer is increased reduces the chip cost as compared with the conventional structure.

In addition, since the current detection cell 22 is disposed adjacent to the principal current cell 21, an element temperature during operation of the current detection cell 22 is brought close to an average element temperature during operation of the principal current cell 21 as compared with the conventional structure. Since the amount of the current of an element depends on the temperature, the current sense ratio between the current detection cell 22 and the principal current cell 21 changes when a temperature difference occurs. Therefore, with the present structure, a current accuracy in current detection is further improved.

Further, since the current detection cell 22 is disposed adjacent to the principal current cell 21, the P-well regions 3a, 3b are not formed in regions away from the source electrodes 9a, 9b. Thus, when the element is switched from an on state to an off state, generation of a displacement current in the current detection cell is suppressed, and a noise current in the current detection cell is suppressed.

Second Embodiment

Figure 3:
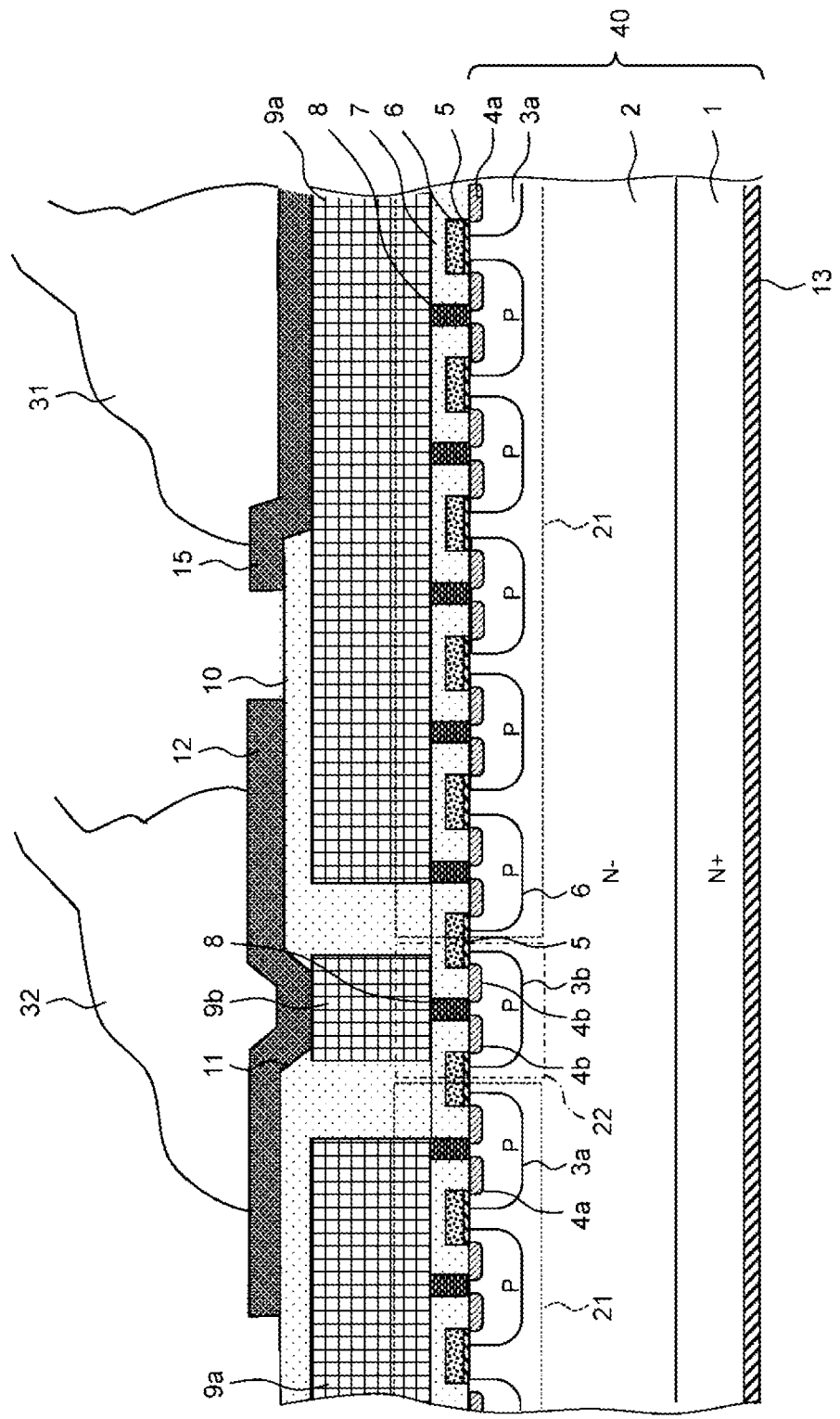
FIG. 3 is a cross sectional view illustrating a semiconductor device according to a second embodiment.

FIG. 3 is a cross sectional view of a semiconductor device according to a second embodiment. FIG. 3 is the cross sectional view taken along the broken line A-A' in FIG. 2. The same portions as those in the cross sectional view of the first embodiment illustrated in FIG. 1 are denoted by the same reference numerals, and the descriptions thereof will be omitted.

The second embodiment is different from FIG. 1 of the first embodiment in that a bonding pad wiring layer 15 is formed on a part of the source electrode 9a connected to the principal current cell 21, and the bonding pad portion 31 is formed on the bonding pad wiring layer 15. The source electrodes 9a, 9b are formed of aluminum, and the bonding pad wiring layer 15 is formed of metal such as copper or nickel formed by a plating method similarly to the bonding pad wiring layer 12. As compared with the case where an aluminum metal bonding pad portion is formed on the source electrodes 9a, 9b formed of the aluminum metal as the conventional structure, material of the bonding pad wiring layer is optimally selected for the bonding pad portion such as copper, and reliability of the bonding pad portion is further enhanced.

Third Embodiment

Figure 4:
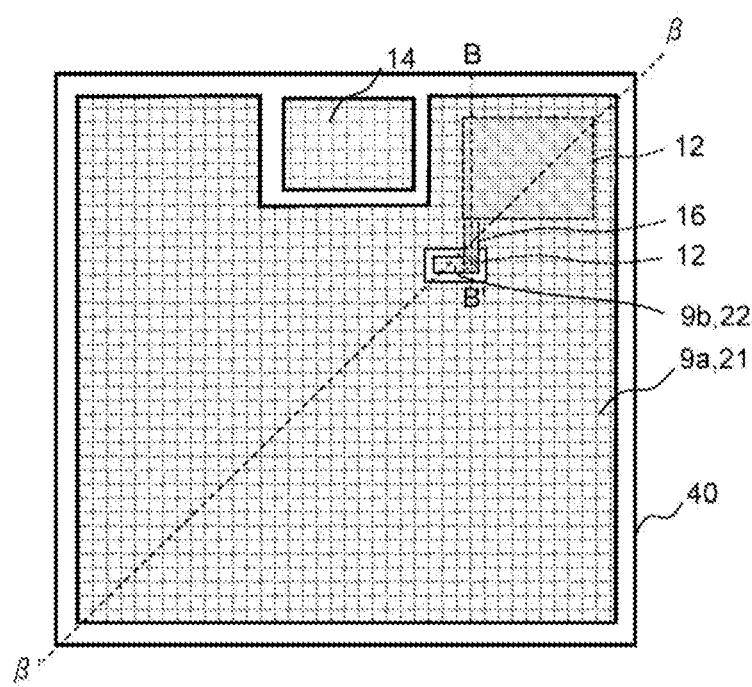
FIG. 4 is a plan view illustrating a semiconductor device according to a third embodiment.
Figure 5:
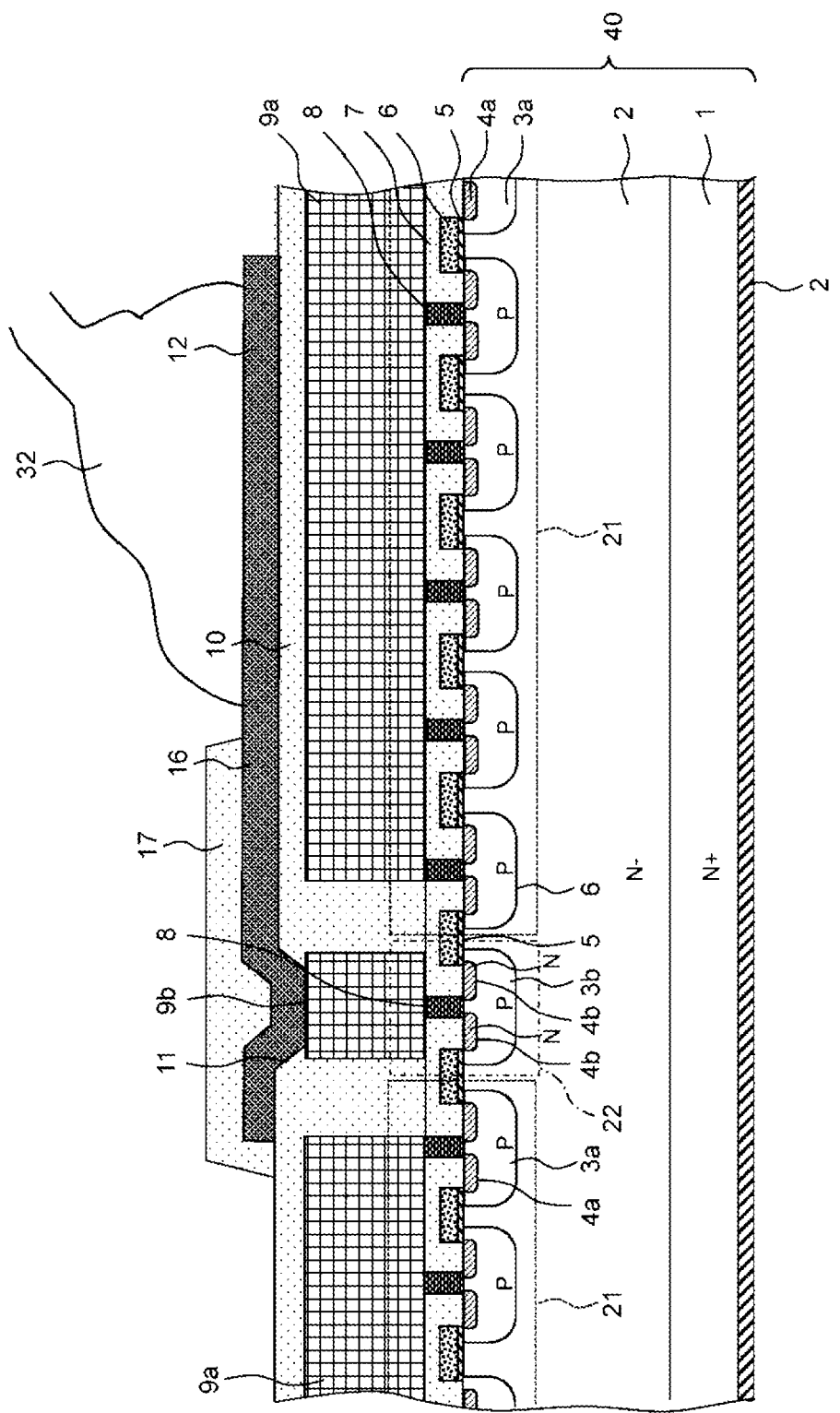
FIG. 5 is a cross sectional view illustrating the semiconductor device according to the third embodiment.

FIG. 4 is a plan view of a semiconductor device according to a third embodiment, and FIG. 5 is a cross sectional view of the same. FIG. 5 is the cross sectional view taken along a broken line B-B' in FIG. 4. The same portions as those in the cross sectional view and the plan view of the first embodiment illustrated in FIGS. 1 and 2 are denoted by the same reference numerals, and the descriptions thereof will be omitted.

The third embodiment is different from the first embodiment in that, as illustrated in FIG. 4, the current detection cell 22 is not disposed under the bonding pad wiring layer 12 and is disposed at a position further close to a chip center. As illustrated in FIG. 5, the current detection cell 22 and the bonding pad wiring layer 12 are connected to each other via the source electrode 9b and a routing wiring layer 16. Although the wire bonding connected to the source electrode 9a of the principal current cell 21 is closely arranged, an electrical short circuit is prevented by forming an insulating film 17 on the routing wiring layer 16.

According to the present embodiment, as compared with the first embodiment, an arrangement position of the current detection cell in the chip is freely arranged without being restricted by an arrangement position of the bonding wire.

Figure 6:
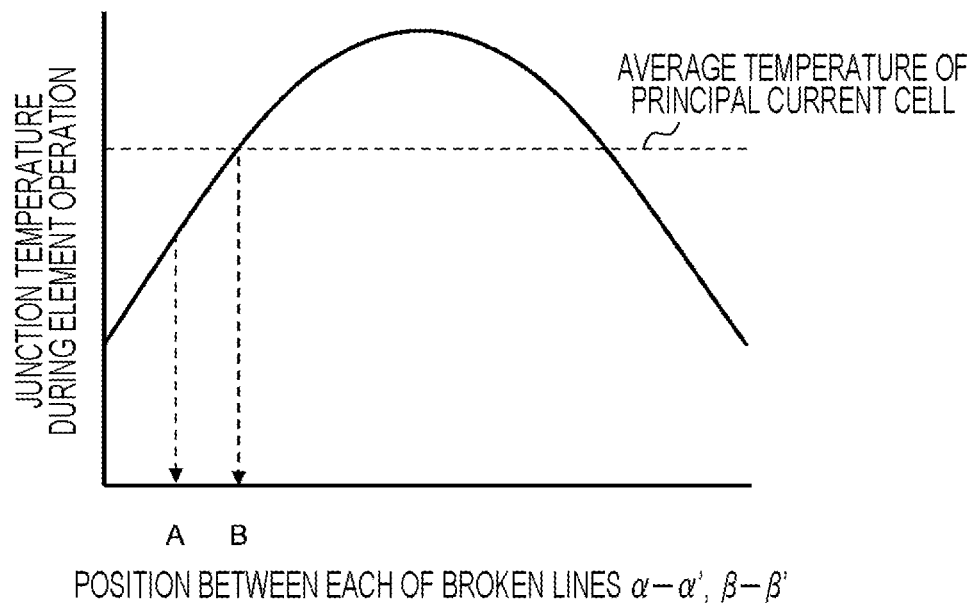
FIG. 6 is a diagram illustrating a junction temperature distribution of a current detection cell.

FIG. 6 is a diagram illustrating a junction temperature distribution of the current detection cell, and shows the distribution of the junction temperatures of the principal current cell 21 and the current detection cell 22 in a broken line α-α' of FIG. 2 and a broken line β-β' of FIG. 4. A horizontal axis represents a distance on the semiconductor device, and a vertical axis represents the junction temperature during element operation.

When a power density per unit area during the operation of the principal current cell 21 and the current detection cell 22 is uniform, the junction temperature of the principal current cell 21 is approximated by a quadratic function as illustrated in FIG. 6, and becomes a maximum at a chip center position and becomes a minimum at a peripheral portion. A position A in FIG. 6 illustrates a case where the current detection cell 22 is located at the position illustrated in FIG. 2 of the first embodiment. A position B in FIG. 6 illustrates a case where the current detection cell 22 is located at the position illustrated in FIG. 4 of the third embodiment. The current detection cell 22 is disposed at the position illustrated in FIG. 4, that is, such that an average temperature of the principal current cell 21 and the temperature of the current detection cell 22 are substantially equal when the current flows through the principal current cell 21 and the current detection cell 22. As a result, as compared with the first embodiment, the element temperature during the operation of the current detection cell 22 is brought further close to the average element temperature during the operation of the principal current cell 21, and the current accuracy in the current detection is further improved. As described above, the bonding pad wiring layer 12 is disposed at an end of the principal current cell 21, and the current detection cell 22 is disposed at an arbitrarily optimum position of the principal current cell 21 via the routing wiring layer 16.

The current detection cell 22 is also arranged at the center portion of the principal current cell 21, at which a maximum temperature of the chip is generated. As a result, the maximum temperature of the chip is detected with high accuracy by detecting the on-resistance of the current detection cell 22 and a forward voltage of a parasitic diode of the current detection cell 22.

Fourth Embodiment

Figure 7:
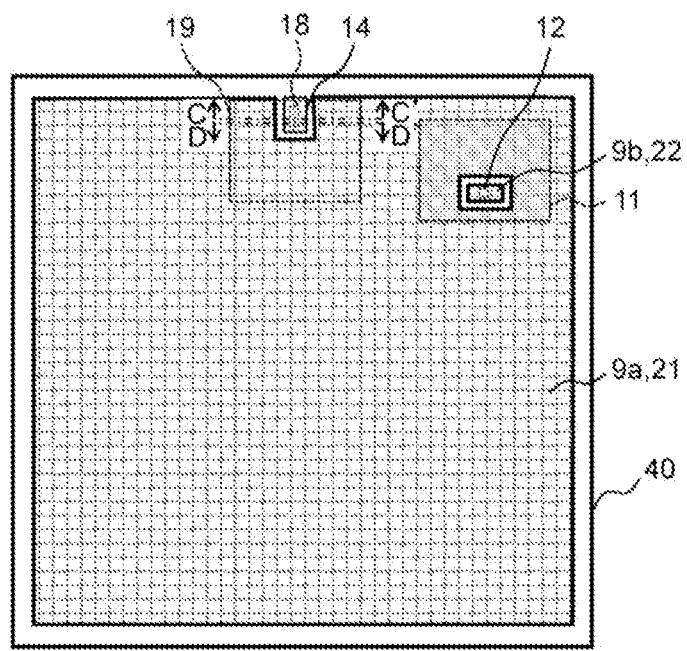
FIG. 7 is a plan view illustrating a semiconductor device according to a fourth embodiment.
Figure 8:
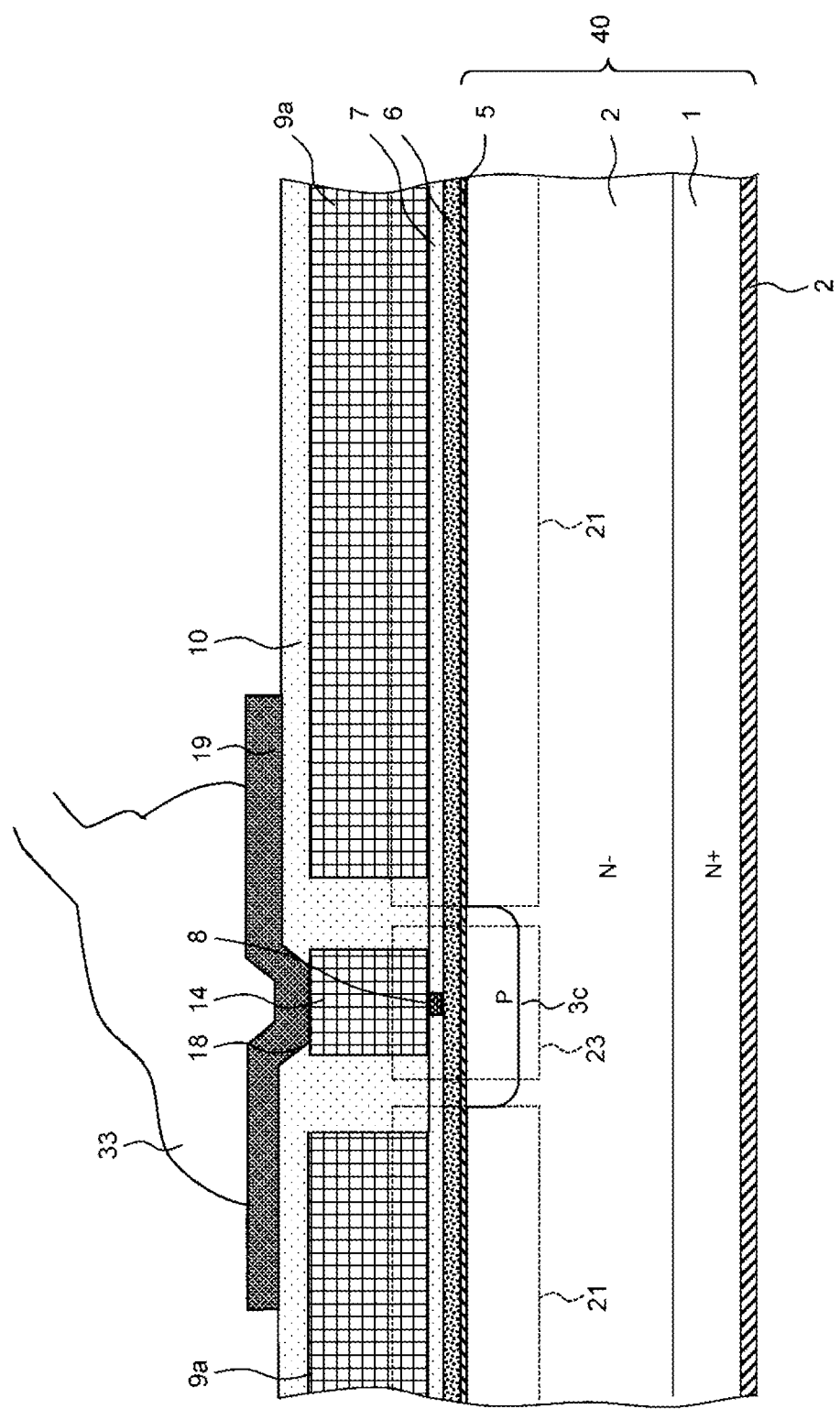
FIG. 8 is a cross sectional view illustrating the semiconductor device according to the fourth embodiment.
Figure 9:
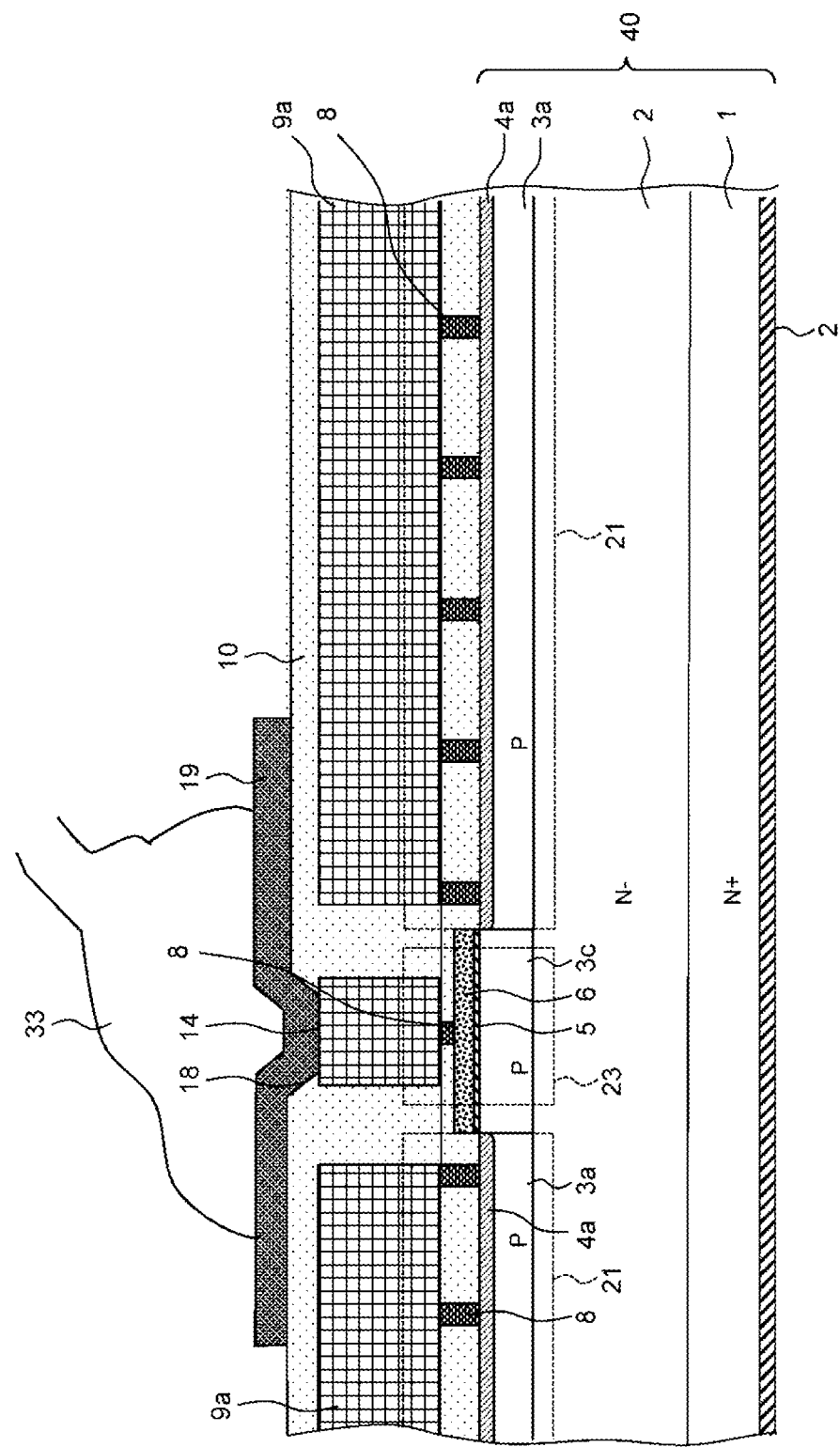
FIG. 9 is a cross sectional view illustrating the semiconductor device according to the fourth embodiment.

FIG. 7 is a plan view of a semiconductor device according to a fourth embodiment, FIG. 8 is a cross sectional view taken along a broken line C-C' in FIG. 7, and FIG. 9 is a cross sectional view taken along a broken line D-D' in FIG. 7. The same portions as those in the cross sectional view and the plan view of the first embodiment illustrated in FIGS. 1 and 2 are denoted by the same reference numerals, and the descriptions thereof will be omitted.

In the first embodiment, as illustrated in FIG. 2, the gate control electrode 14 is the bonding pad region, and the bonding pad portion is connected on the gate control electrode 14. On the other hand, in the present embodiment, as illustrated in FIGS. 7, 8, and 9, the gate control electrode 14 is connected to a bonding pad wiring layer 19 formed on the interlayer insulating film 10 on the gate control electrode 14 via a wiring layer contact 18. A wiring layer of the gate electrode 6 connected to a gate of the principal current cell is illustrated in FIG. 8, and a wiring layer of the contact 8 and the source region 4a is illustrated in FIG. 9. An area on the plane of the gate control electrode 14 is smaller than an area of the bonding pad wiring layer 19, and the principal current cell 21 and the source electrode 9a of the principal current cell are disposed under a part of the bonding pad wiring layer 19 connected to a gate cell 23. In other words, the bonding pad wiring layer 19 is connected to the gate control electrode 14, and is formed with respect to the source electrode 9a so as to cover a part of the source electrode 9a via the interlayer insulating film 10. The gate cell 23 controls the amount of current output from the principal current cell 21. The gate control electrode 14 is the same as that of the other embodiments in that the gate control electrode 14 is connected to the gate electrodes 6 of the principal current cell 21 and the current detection cell 22 with the polysilicon layer constituting the gate electrode 6.

Since the bonding pad wiring layer 19 is provided on the gate control electrode 14, the area on the plane of the gate control electrode 14 is made smaller than the area of the bonding pad wiring layer 19, and the principal current cell 21 and the source electrode 9a of the principal current cell is arranged close to the gate control electrode 14. Therefore, the area on the plane of the principal current cell is further enhanced. As a result, the on-resistance of the principal current cell is reduced, and performance is further improved. In addition, when the area on the plane of the principal current cell is fixed, a chip area is reduced, and the chip cost is reduced.

Although in each of the above embodiments, the semiconductor device using the silicon carbide semiconductor substrate 40 has been described, a semiconductor substrate made of such as silicon, gallium nitride, gallium oxide, or diamond is also used. In particular, in the semiconductor substrate made of the silicon carbide, the gallium nitride, the gallium oxide, or the diamond, a ratio of the cost of the semiconductor substrate to the total chip cost is large, so that the chip cost is effectively reduced.

Although the semiconductor device is externally connected with the bonding pad portion and the bonding wires, the bonding pad portion and the bonding wires may be connected with a lead frame made of copper or the like and soldering or the like.

According to the embodiments described above, the following effect is obtained.

(1) The semiconductor device includes the semiconductor substrate 40 having a first main surface and a second main surface; the principal current cell formed on the semiconductor substrate 40 and having the source electrode 9a formed on the first main surface and the drain electrode 13 formed on the second main surface; a sub-cell (the current detection cell 22, the gate cell 23) formed on the first main surface and having a third electrode (the gate control electrode 14, the source electrode 9b) formed at a position of the same height as the source electrode 9a with respect to the semiconductor substrate 40; the bonding pad wiring layer 12 connected to the third electrode (the gate control electrode 14, the source electrode 9b) and formed with respect to the source electrode 9a so as to cover a part of the source electrode 9a via the interlayer insulating film; and the bonding pad portion 32 connected to the first bonding pad wiring layer 12. According to the above structure, the area of the principal current cell is increased regardless of the area of the bonding pad wiring layer for the sub-cell.

It is to be understood that the present invention is not limited to the above embodiments, and other forms conceivable within the scope of the technical idea of the present invention are also included within the scope of the present invention as long as the features of the present invention are not impaired.

REFERENCE SIGNS LIST

1 N+ type drain region
2 N− type drain drift region

3a P-well region of principal current cell
3b P-well region of current detection cell
4a N+ source region of principal current cell
4b N+ source region of current detection cell
5 gate oxide film
6 gate electrode
7 interlayer insulating film
8 contact
9a source electrode of principal current cell
9b source electrode of current detection cell
10 interlayer insulating film
11 wiring layer contact
12 bonding pad wiring layer
13 drain electrode
14 gate control electrode
15 bonding pad wiring layer
16 routing wiring layer
17 insulating film
18 wiring layer contact
19 bonding pad wiring layer
21 principal current cell
22 current detection cell
23 gate cell
31, 32, 33 bonding pad portion
40 silicon carbide semiconductor substrate

The invention claimed is:

1. A semiconductor device comprising:
a semiconductor substrate having a first main surface and a second main surface;
   a principal current cell formed on the semiconductor substrate and including a first electrode formed on the first main surface and a second electrode formed on the second main surface;
   a sub-cell formed on the first main surface and including a third electrode formed at a position of the same height as the first electrode with respect to the semiconductor substrate, wherein a size of the third electrode is substantially equal to a size of the sub-cell;
   a first bonding pad wiring layer connected to the third electrode and formed with respect to the first electrode so as to cover a part of the first electrode via an interlayer insulating film; and
   a first bonding pad portion connected to the first bonding pad wiring layers and
   wherein the sub-cell is disposed closer to a central portion of the semiconductor substrate than the first bonding pad portion connected to the sub-cell.

2. The semiconductor device according to claim 1, wherein
the sub-cell is a current detection cell that detects an amount of current corresponding to an amount of current output from the principal current cell.

3. The semiconductor device according to claim 1, wherein
the sub-cell is a gate cell that controls the amount of current output from the principal current cell.

4. The semiconductor device according to claim 2, wherein
a plane size of the sub-cell with respect to the semiconductor substrate is smaller than a plane size of the first bonding pad portion with respect to the first bonding pad wiring layer.

5. The semiconductor device according to claim 2, wherein
the current detection cell is surrounded on all sides by the principal current cell.

6. The semiconductor device according to claim 2, wherein the current detection cell is disposed closer to the central portion of the semiconductor substrate resulting in an average temperature of the principal current cell and a temperature of the current detection cell substantially equal when current flows through the principal current cell and the current detection cell.

7. The semiconductor device according to claim 1, wherein
a second bonding pad wiring layer is formed on a part of the first electrode, the first electrode and the second bonding pad wiring layer are electrically connected, and a second bonding pad portion is connected to the second bonding pad wiring layer.

\* \* \* \* \*